United States Patent

Cramer et al.

[15] 3,658,629

[45] Apr. 25, 1972

[54] PHOTOPOLYMER RESIST SHEET LAMINATOR

[72] Inventors: Lawrence P. Cramer, Endwell, N.Y.; Harold B. Irons, Yokohama, Japan; Harold Kohn, Endwell; John P. Mathis, Endicott, both of N.Y.

[73] Assignee: International Business Machines Corporation, Armonk, N.Y. by said Cramer

[22] Filed: Feb. 27, 1970

[21] Appl. No.: 15,165

[52] U.S. Cl. ..............................156/552, 156/553, 156/555, 156/583

[51] Int. Cl. ...................................B32b 31/10, B32b 31/20

[58] Field of Search..................156/359, 522, 550, 552, 553, 156/555, 581, 582, 583; 100/176; 83/487, 488, 614

[56] References Cited

UNITED STATES PATENTS

| | | | |
|---|---|---|---|
| 3,158,523 | 11/1964 | Morrow | 156/522 |
| 3,208,898 | 9/1965 | Chavannes et al. | 156/553 X |
| 3,361,608 | 1/1968 | Janetos et al. | 156/583 X |
| 3,438,835 | 4/1969 | Chen et al. | 156/555 X |
| 3,258,385 | 6/1966 | Lake | 156/581 |
| 2,805,828 | 9/1957 | Bachman | 83/488 X |
| 3,068,933 | 12/1962 | Klar | 156/582 X |
| 3,453,169 | 7/1969 | Buck et al. | 156/552 |
| 3,309,983 | 3/1967 | Dresser | 156/555 |

*Primary Examiner*—Benjamin A. Borchelt
*Assistant Examiner*—J. M. Hanley
*Attorney*—Sughrue, Rothwell, Mion, Zinn & Macpeak

[57] ABSTRACT

The resist laminator receives a panel between two identical drums and a sheet of photo resist material is placed on opposite sides of the panel simultaneously prior to feeding the laminated assembly to curing rollers. When the panel is received between the drums the resist material is secured only at the leading edge to prevent the formation of wrinkles or other defects during the curing operation. The sheets of photo resist material are pre-cut to the exact size of the panel and held on the surface of the drums by means of a vacuum applied interiorly of the drum.

5 Claims, 6 Drawing Figures

INVENTOR

LAWRENCE P CRAMER

BY Sughrue, Rothwell, Mion, Zinn & Macpeak

ATTORNEYS

PHOTOPOLYMER RESIST SHEET LAMINATOR

BACKGROUND OF THE INVENTION

1. Field of the Invention

The present invention is directed broadly to the manufacture of printed circuit boards and more specifically to a laminator for securing precut sheets of resist simultaneously to opposite sides of a panel.

2. Prior Art

Laminators for securing sheets of resist material simultaneously to opposite sides of a panel are known in the art but these machines only were able to select the width ahead of time by cutting the rolls to the desired dimension. The sheet material was drawn from the rolls and laminated to both sides of a plurality of panels being fed in sequence between the two sheets of resist material. In this manner, the individual panels would be connected together by a finite length of resist material thereby stringing the panels together like link-sausages. It was then necessary to cut the individual panels apart and perform time consuming and costly trimming operations.

SUMMARY OF THE INVENTION

The present invention provides a laminator which will cut sheets of resist and laminate them to panels within a defined perimeter. As the sheet of resist material is fed from the roll to the drum, a vacuum will hold the resist material in place on the surface of the drum and a cutter will operate at predetermined locations on the drum to cut the sheets into the desired individual length for application to the individual panels.

The present invention provides a laminator wherein the leading edge only of each sheet of resist material is pressure sealed to the leading edge of the board by means of opposed pressure strips located on the opposed drums. The pressure securement of the leading edge of the film will be sufficient to pull the remaining portion of the sheet from the vacuum applied to the interior of the drum and will properly orient the sheets on the opposite sides of the panel for feeding into heating rolls for permanently securing the pre-cut sheets of resist material to opposite sides of the panel.

The laminator claimed in the present invention provides sheets of resist material which are cut to size before application and the sheets are automatically registered on the panel both sidewise and endwise.

The present invention provides a laminator which realizes a substantial savings in the cost of resist material since the sheets are accurately pre-cut without any need for wasteful trimming operations.

The present invention provides a laminator which is substantially faster inasmuch as time consuming cutting and trimming operations are completely eliminated.

These advantages and others obvious to those skilled in the art will become apparent from the following description of the invention taken in conjunction with the drawings.

IN THE DRAWINGS

DETAILED DESCRIPTION OF THE INVENTION

Figures 1, 2, 3:
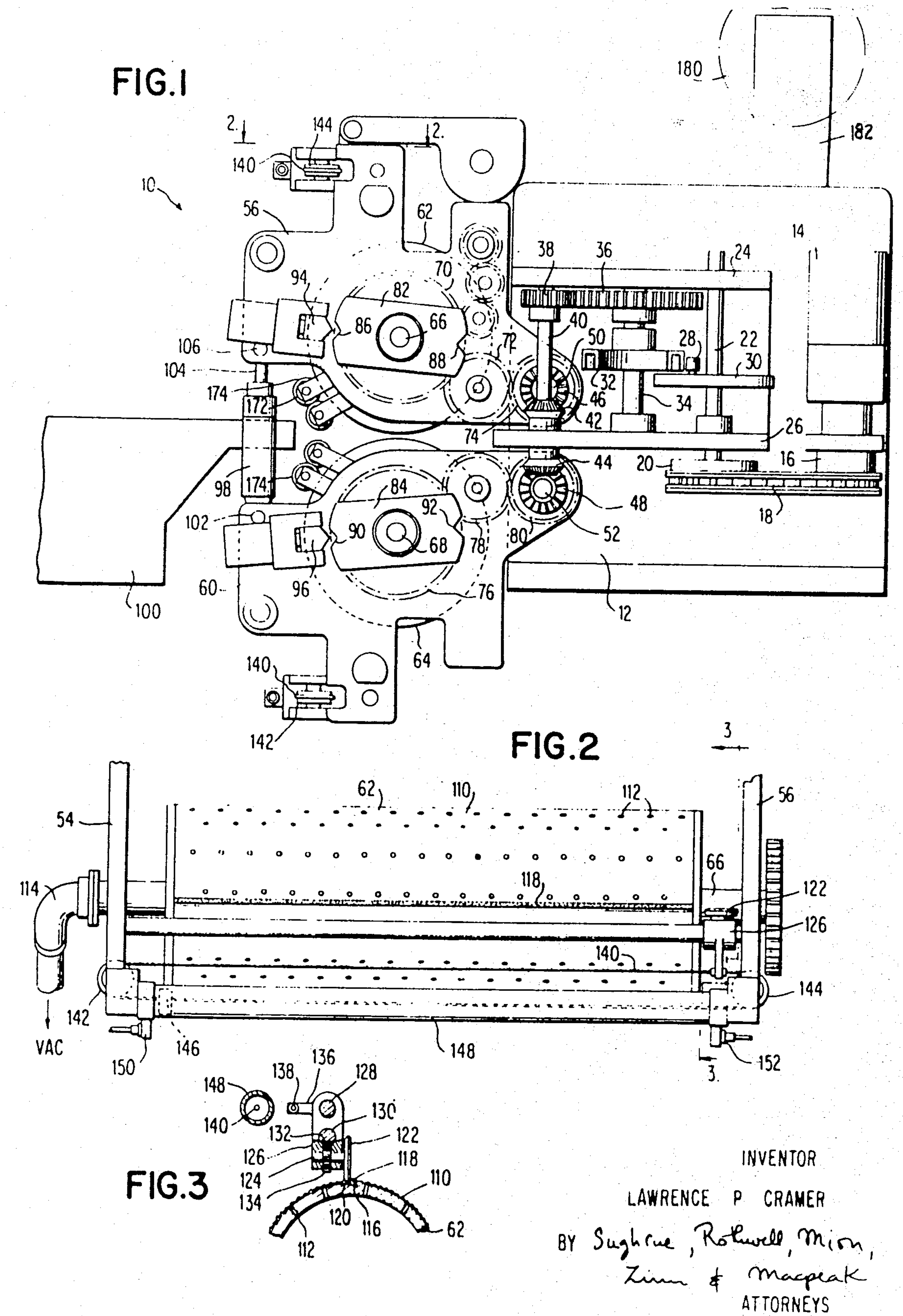
FIG. 1 is a side elevation view of the laminator according to to the present invention.
FIG. 2 is a sectional view taken along the lines 2—2 of FIG. 1.
FIG. 3 is a sectional view taken along the lines 3—3 in FIG. 2.

The laminator according to the present invention is used in the processing of standard 10 inch × 15 inch panels and boards of varying thicknesses from between 0.005 and 0.125 inches. The specific function of the laminator is to apply layers of photo resist material and protective layers of mylar to both sides of the 10×15 inch panels being processed. The resist laminator receives clean 10 × 15 inch panels from any suitable input means and applies the photo resist material and mylar to both sides of the panel simultaneously and supplies the laminated panels to a suitable output conveyor and storage means. The entire process may be controlled automatically by suitable means well known to one skilled in the art. The laminator, indicated generally at 10 is comprised of a main frame 12 having a main laminator drive motor 14 mounted thereon and provided with a vertically disposed output shaft. A sprocket 16 is mounted on the shaft of the motor 14 and a sprocket chain 18 is trained about the sprocket 16 and a second sprocket 20 secured to shaft 22 rotatably journaled in spaced apart flanges 24 and 26 on the side of the main frame 12. A drive pin 28 is mounted on the upper surface of a disc 30 secured to the shaft 22 and cooperates with a Geneva gear 32 for imparting intermittent rotation to the shaft 34 also journaled for rotation in the flanges 24 and 26. A gear 36 is secured to the shaft 34 and is disposed in mesh with a gear 38 mounted on a shaft 40 which is journaled for rotation between the flanges 24 and 26. A pair of beveled gears 42 and 44 are secured to the shaft 40 for driving a pair of complementary beveled gears 46 and 48 respectively. The gears 46 and 48 are journaled about stub shafts 50 and 52 which are secured to the main frame 12.

A pair of end plates 54 and 56 are pivotably secured to the main frame 12. The pivotal connection for the end plate 56, is the stub shaft 50 as shown in FIG. 1. A corresponding pair of end plates 58 and 60 (only one of which is shown in FIG. 1) are also pivotally mounted on the main frame 12 with the end plate 60 being pivoted on the stub shaft 52. A pair of identical laminating drums 62 and 64 are secured to shafts 66 and 68 respectively, which in turn are journaled in the end plates 54, 56 and 58, 60.

The shaft 66 and the drum 62 secured thereto are rotated through gear 70 which is secured to the shaft 66, gear 72 and gear 74 which is secured for rotation with beveled gear 46. The drum 64 and the shaft 68 secured thereto are rotated by means of gear 76 secured to the shaft 68, gear 78 and gear 80 which is secured for rotation with the beveled gear 48. Detent plates 82 and 84 are secured to the shafts 66 and 68 respectively and are provided with diametrically opposite notches 86, 88 and 90, 92. Detent pins 94 and 96 are mounted on the frame 12 for cooperation with the notches and are operable under control of any suitable means such as a solenoid or pneumatic piston and cylinder arrangement.

A cylinder 98 is secured to an auxillary frame member 100 and the closed end of the cylinder is also secured to the end plate 60 at 102. A piston having a piston rod 104, is disposed withing the cylinder 98 and the opposite end of the piston rod 104 is connected to the end plate 56 at 106. A similar piston and cylinder arrangement may be provided between the end plates 54 and 58 and upon admission of pressurized fluid to the cylinders the end plates 56 and 54 will pivot upwardly as viewed in FIG. 1 to increase the separation distance between the drums 62 and 64.

The details of the laminating drum and cutter arrangement are best shown in FIGS. 2 and 3 and since the upper and lower drum and cutter arrangements are identical, the details of the upper drum and cutter only will be described. The drum 62 is a hollow cylindrical drum which is formed with a knurled surface 110 and plurality of perforations 112 extend therethrough into the interior of the drum. The ends of the drum 62 are sealed and a vacuum is applied to the interior of the drum through a bore (not shown) in shaft 66 and a coupling 114 which leads to any suitable vacuum source means.

At diametrically spaced locations a pair of dovetail grooves 116 are formed in the surface of the drum 62 parallel to the axis of the drum. A rubber strip 118 having a complementary cross-sectional configuration is disposed in each groove 116 and protrudes slightly beyond the circumference of the drum 62. One wall of each groove 116 adjacent the leading edge of the groove if the drum were travelling in a counter clockwise direction as viewed in FIG. 3, is cut away as at 120 to provide the necessary clearance for a cutter wheel.

The cutter is comprised of a rotatable cutting disc 122 which is secured to a shaft mounted for rotation in a block member 126 which is mounted for sliding movement on spaced parallel rods 128 and 130. Rod 130 has a plurality of gear teeth 132 machined in the lower surface thereof in mesh with a gear 134 secured to the shaft 124. Thus, upon traversing movement of the support block 126 along the rods 128 and 130, the meshing of the gear 134 with the teeth 132 will cause the cutter wheel 122 to rotate. The cutting edge will be disposed between the edge 120 of the notch 116 and the rubber strip 118 disposed in the notch 116.

Figure 4:
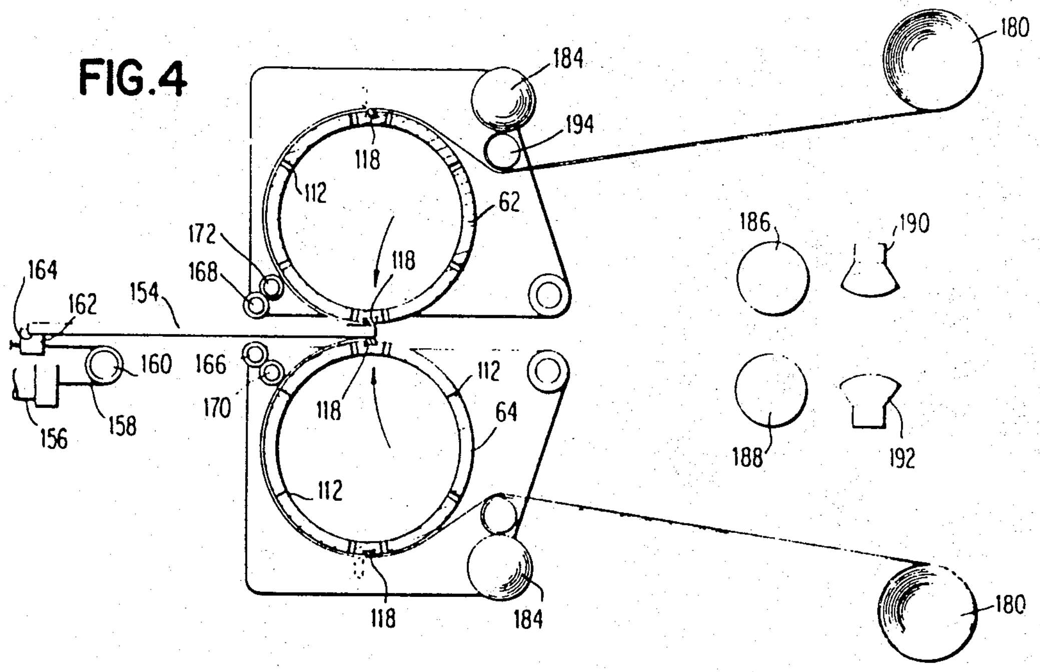
FIG. 4 is a schematic end view of the apparatus showing the relationship of a panel in position between the drums for the pressure securement of the sheets of resist material thereto.
Figure 5:
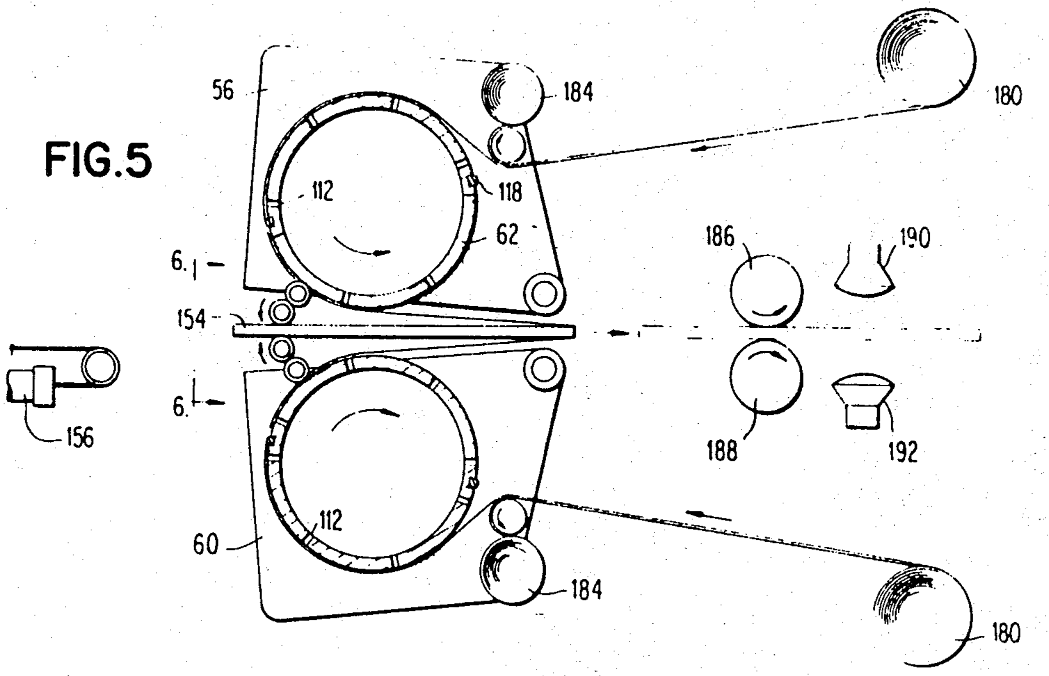
FIG. 5 is a view similar to FIG. 4 showing the panel being fed between the drums toward the laminating rollers.
Figure 6:
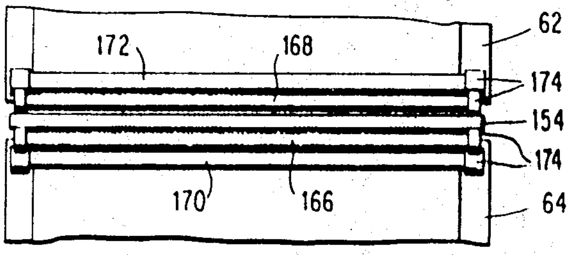
FIG. 6 is a view taken generally along the lines 6—6 in FIG. 5.

The guide block 126 is provided with an arm 136 with an eyelet 138 at one end thereof. A cable 140 passes through the eyelet and means are provided for securing the eyelet to the cable such as a set screw, or the like (not shown). The cable 140 is trained about a pair of pulleys 142 and 144 journaled for rotation in the end plates 54 and 56 respectively. The two ends of the cable are secured to a piston 146 which is guided for movement within the cylinder 148 mounted on the two end plates 154 and 156 and extending parallel to the guide rods 128 and 130. Pressurized fluid may be supplied to either end of the cylinder 148 through fittings 150 and 152 in order to reciprocate the piston 146 within the cylinder 148. The board or panel 154 to which the photo resist material is to be laminated is initially fed into the proper position between the drums 62 and 64 by means of a reciprocating feed device similar to the above-described arrangement for reciprocating the cutter. A cylinder 156 is provided with a reciprocating piston internally thereof (not shown) and the cable 158 is secured to each end of the piston. The cable 158 is trained above sheaves 160 and the cable is secured to a push bar 162 having a notch 164 therein for gripping the panel 154. When the pusher bar 162 reaches its limit of travel, as defined by the length of the cylinder 156, the leading edge of the panel 154 will be disposed between opposed rubber strips 118 in the manner as shown in FIG. 4.

In order to advance the panel 154 between the drums, a pair of feed rollers 166 and 168 are provided on opposite sides of the panel 154. The rollers 166 and 168 receive their drive from the laminating drums 62 and 64 through intermediate rollers 170 and 172 respectively, in order that the rollers 170 and 172 do not contact the photo resist material which is being conveyed on the surface of the drum. Each roller is provided with a friction strip 174 which contacts only the extreme end surfaces of the drum 62. Although the rollers 166, 168, 170 and 172 are mounted for movement with the end plates between which they are mounted. The rollers are further mounted for independent movement toward and away from the panel 154 to be laminated. Such a mounting arrangement would be obvious to one skilled in the art, and since the details as such do not form any part of the present invention, only a schematic showing of the same has been provided.

A roll 180 of the resist material may be mounted on the main frame 12 by any suitable brackets 182. The material as wound up on the roll 180 is a three ply assembly comprising an inner layer of mylar, the photo resist material and a sheet of polyethylene lining material. As the three ply assembly is fed from the roll 180 as viewed in FIG. 4, the top most polyethylene layer is wound up on a take-up roller 184 so that as the remaining two plys, consisting of the mylar and the photo resist material pass over the drum 62, the photo resist material will be disposed face down or disposed in intimate contact with the surface of the board 154. A similar feeding and take-up arrangement for the polyethylene is provided with respect to the lower drum 64. A pair of curing rollers 186 and 188 are provided to the right of the laminating drums 62 and 64 as viewed in FIG. 4, and heating lamps 190 and 192 are shown schematically adjacent thereto, in order to bond the photo resist material to the panel 154.

A complete sequence of operation of the laminator will now be described in detail. When the three ply film is unspooled from the supply 180, it will pass around the roller 194 and be brought into intimate contact with the surface of the roller. Since a vacuum is applied to the interior of the drum 62, the vacuum will also be applied to the holes 112 thereby holding the three ply film in contact with the knurled surface of the drum 62. The layer of polyethylene will be wound up on the roll 184 and the mylar and photo resist material will be disposed with the leading edges thereof disposed along the leading edge of the exposed portion of the rubber strip 118 as the drum 62 rotates in a counter-clockwise direction. Initially, the drum 62 will be rotated to bring the leading edge of the material to the lowermost position as viewed in FIG. 4, at which time the cutter mechanism will be operated to shift the cutter from one end of the drum 62 to the opposite end of the drum, thereby cutting off a sufficient length of material to exactly cover the panel 154. The cutter wheel travels closely adjacent the leading edge of the diametrically opposite rubber strip 118, so that the material will be properly located for the next succeeding application.

With the drum members 62 and 64 spaced apart and the leading edge of the mylar-photo resist laminate being disposed over the opposed rubber strips 118, the panel feed mechanism 156 will be operated to shift a panel 154 into the position shown in FIG. 4 with the leading edge thereof disposed adjacent the leading edges of the strips 118 with respect to their direction of rotation. Next, the drums 62 and 64 are brought together with the protruding rubber strips 118 pressing the leading edges of the mylar photo resist laminates into pressure sealed contact with the opposite surfaces of the panel 154. As mentioned previously, the photo resist material will be disposed adjacent the surfaces of the panel with the mylar acting as a protective surface, until such time as it is desired to proceed further with the preparation of the printed circuit board. Subsequent to the pressure sealing step, the drums 62 and 64 are again separated by the operation of the piston and cylinder arrangement 98 and the feed rollers 166 and 168 are moved into intimate feeding contact with the lower and upper surfaces of the panel 154 respectively. The drums are now indexed 180° by means of the Geneva drive mechanism previously described and the exact home location of the drums is provided by the detents 94 and 96 cooperating with the notches 86 and 90. During this indexing movement of the drums, the two ply laminates will be held on the surface of each drum by means of the vacuum applied to the interior of the drum and since the two ply laminates are secured to the opposite surfaces of the panel 154 along the leading edges thereof, the feeding movement of the panel 154 between the drums will thereby pull the two ply laminates off the surface of each drum into contact with the upper and lower surfaces of the panel 154. As the panel emerges from between the drums the laminates will be held in intimate contact with the panel by the pressure seal along the leading edge and the natural adhesion characteristics of the resist material over the remainder. The panel 154 will then be fed directly between the curing rollers 186 and 188 and the photo resist material will be bonded to the panel. The next pair of rubber strips 118 will now be disposed in opposing relationship for the reception of another panel and the cycle of operations will be repeated.

Although only two strips 118, spaced diametrically opposite each other, have been shown it is obvious that additional strips may be provided as long as they are spaced equi-distant from each other so that uniform increments of drum rotation may be employed.

It is important to note that the mylar-photo resist laminate is only secured to the panel along the leading edge thereof as a result of the pressure contact, so that the remainder of the upper and lower sheets will be smoothly bonded to the panel 154 without any wrinkles as was the case in previous devices when the entire sheet was temproarily secured to the surface of the panel before heat curing. This is due to the fact that during sheet curing, the photo resist tends to expand slightly and if the sheet is already secured to the panel, wrinkling will occur.

The sequencing of the various movements may be controlled by any suitable means well known to those skilled in the art, and since the details of the control system do not form a part of the present invention, the same has not been described in detail.

What is claimed is:

1. In a laminator for simultaneously applying sheets of material to opposite sides of a panel coextensively with the surface area of each side wherein the laminator is provided with a pair of spaced apart rotatable cylindrical laminating drums, and feed means for inserting a panel between said drums, the improvement comprising vacuum means for holding said material on the surface of said drums, at least two equally spaced apart grooves formed in the surface of each drum lengthwise thereof, resilient pad means dispersed in and protruding from each groove, means for moving said drums toward and away from each other; said drums each having an equal number of grooves therein with said drums being angularly oriented with respect to each other whereby each groove on one drum is periodically opposed to a corresponding groove on the drum to enable said pad means therein to press-seal said material to opposite sides of said panel simultaneously upon movement of said drums toward each other, cutter means, means supporting and guiding said cutter means parallel and adjacent to one of said grooves on each drum, means for reciprocating each of said cutter means along said grooves to cut a length of material from a continuous roll of material adjacent the leading edge of the pad means in said groove on each drum and additional feed means for passing said panel between said drums subsequent to the press-sealing of said sheets therein upon rotation of said drum to index the next groove on each drum into opposed relation and to remove said cut sheets of material from said drums into intimate non-sealed relation with the opposite surfaces of said panel.

2. In a laminator as set forth in claim 1 wherein each of said drums is provided with a hollow interior, a plurality of perforations connecting the surface thereof with said interior and connecting means for connecting the interior to a vacuum source to define said vacuum means.

3. In a laminator as set forth in claim 2 wherein the curved surface of each cylindrical drum is knurled to provide a more uniform vacuum effect to hold the material on said drums.

4. In a laminator as set forth in claim 1 wherein said cutter means is comprised of a rotatable disc guided to dispose the edge of said disc in a groove adjacent the pad means in said groove and further comprising means for rotating said disc.

5. In a laminator as set forth in claim 1 wherein said feed means is adapted to insert the leading edge of a panel between said drum whereby the sheets of material are press-sealed only along the leading edge of said panel.

* * * * *

UNITED STATES PATENT OFFICE
CERTIFICATE OF CORRECTION

Patent No. 3,658,629 Dated July 10, 1972

Inventor(s) Lawrence P. Cramer, Harold B. Irons, Harold Kohn and John P. Mathias It is certified that error appears in the above-identified patent and that said Letters Patent are hereby corrected as shown below:

In the Heading: Please change "John P. Mathis" to --John P. Mathias--

After "assignors to International Business Machines Corporation, Armonk, N.Y." delete "by said Cramer".

Signed and sealed this 24th day of October 1972.

(SEAL)
Attest:

EDWARD M.FLETCHER,JR.
Attesting Officer

ROBERT GOTTSCHALK
Commissioner of Patents

ORM PO-1050 (10-69)

USCOMM-DC 60376-P69
☆ U.S. GOVERNMENT PRINTING OFFICE : 1969 O—366-334